United States Patent [19]
Furuno

[11] 3,982,186
[45] Sept. 21, 1976

[54] FM RECEIVER WITH DETECTOR FOR MULTI-PATH RECEPTION

[75] Inventor: Hiroshi Furuno, Tokyo, Japan

[73] Assignee: Sony Corporation, Tokyo, Japan

[22] Filed: Apr. 22, 1975

[21] Appl. No.: 570,358

[30] Foreign Application Priority Data
May 1, 1974 Japan.............................. 49-49180

[52] U.S. Cl.............................. 325/344; 325/363; 325/398
[51] Int. Cl.².......................................... H04B 1/06
[58] Field of Search ........... 325/344, 347, 349, 473, 325/479, 472, 363, 65, 398; 179/15 BT

[56] References Cited
UNITED STATES PATENTS

| | | | |
|---|---|---|---|
| 2,837,636 | 6/1958 | Richard, Jr. .......................... | 325/363 |
| 3,125,640 | 3/1964 | von Recklinghausen ....... | 179/15 BT |
| 3,525,045 | 8/1970 | von Recklinghausen .......... | 325/347 |
| 3,881,155 | 4/1975 | Saikaishi............................. | 325/363 |

*Primary Examiner*—Robert L. Griffin
*Assistant Examiner*—Jin F. Ng
*Attorney, Agent, or Firm*—Lewis H. Eslinger; Alvin Sinderbrand

[57] ABSTRACT

In an FM receiver having a circuit including RF and IF amplifiers for receiving a selected FM broadcast signal, and an FM detector for converting the selected FM broadcast signal to an audio signal which is applied through an audio amplifier to a loudspeaker for operating the latter and thereby producing a corresponding audible sound; the presence of amplitude-modulated components in the selected FM broadcast signal, for example, by reason of the multi-path reception of such broadcast signal at the antenna, is made effective to produce low frequency signals, for example, by amplitude-detecting the output of the IF amplifier, and such low frequency signals are selectively applied to the audio amplifier in place of the audio signal from the FM detector so that the loudspeaker produces a characteristic sound for indicating the existence of multi-path reception. Preferably, the gain of at least the IF amplifier is lowered when detecting the existence of multi-path reception, for example, by selectively applying the low frequency signals through a smoothing circuit to the IF amplifier as an automatic gain control signal for the latter, so that the limiter effect of the circuit for receiving a selected FM broadcast signal will not preclude the amplitude-detection of the IF amplifier output when the selected FM broadcast signal is at a high level.

7 Claims, 1 Drawing Figure

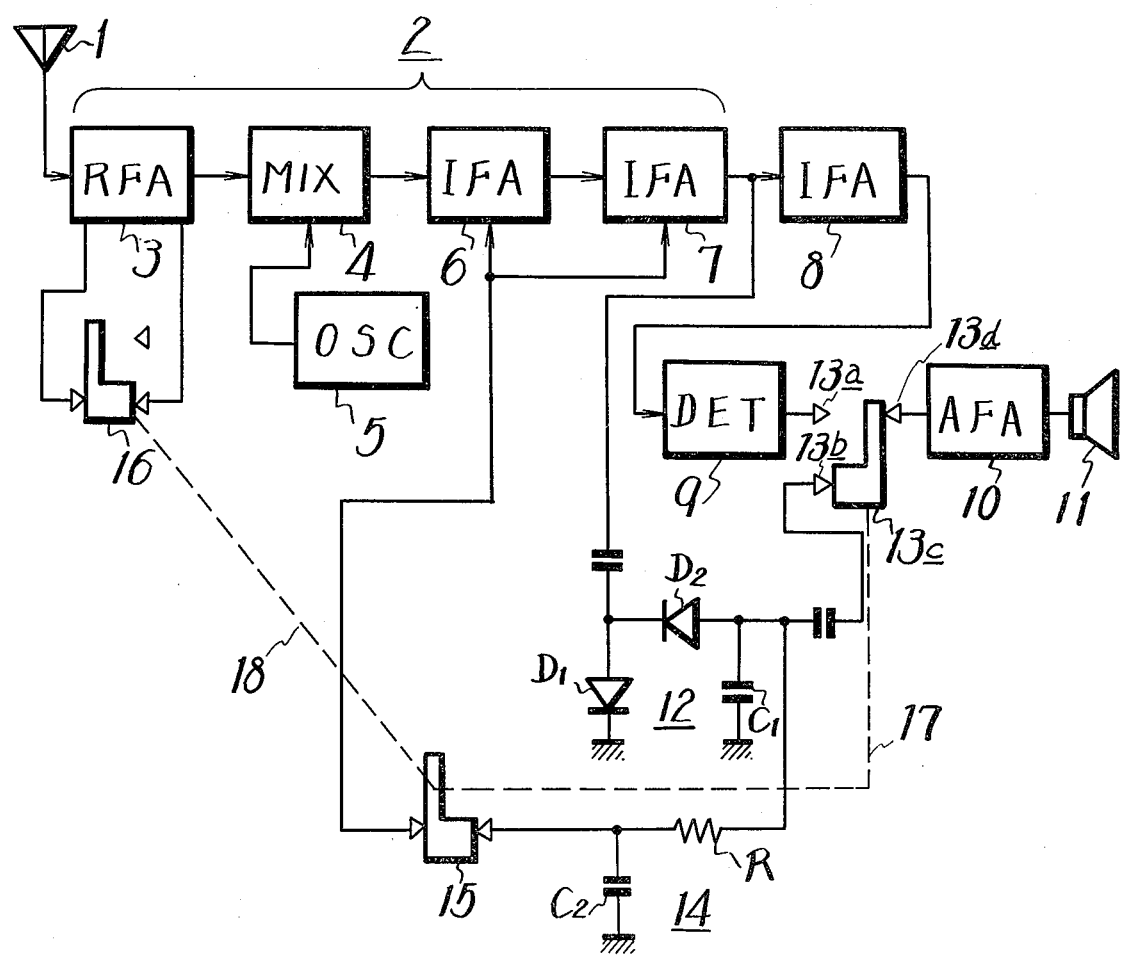

FM RECEIVER WITH DETECTOR FOR MULTI-PATH RECEPTION

BACKGROUND OF THE INVENTION

1. Field of the Invention

This invention relates generally to an FM receiver, and more particularly is directed to an FM receiver provided with an arrangement by which the multi-path reception of a selected FM broadcast signal can be detected.

2. Description of the Prior Art

When the antenna of an FM receiver receives both radio waves arriving directly from the transmitting antenna and reflected waves which are deflected by mountains, buildings and the like, the received FM broadcast signal is subjected to amplitude and phase modulation due to the fact that the reflected waves or signals are shifted in time relative to the directly received waves or signals. Although the amplitude-modulated components of the received FM broadcast signal can be reduced by the limiter usually contained in the IF amplifier of the FM receiver, the phase-modulated components cannot be thus removed.

In order to avoid the foregoing problem, it has been proposed in the prior art to provide an FM receiver with an oscilloscope by which the user can observe the presence of a characteristic waveform on the oscilloscope when the selected FM broadcast signal contains amplitude-modulated components as a result of the so-called multi-path reception of the FM broadcast signal, whereupon the user can adjust the position of the receiving antenna until such characteristic waveform is removed from the oscilloscope. However, since an oscilloscope is relatively expensive and is not susceptible to inclusion in a desirably compact FM receiver, the foregoing proposal for detecting multi-path reception is not desirable.

OBJECTS AND SUMMARY OF THE INVENTION

Accordingly, it is an object of this invention to provide an FM receiver with a relatively simple and inexpensive arrangement for detecting multi-path reception without substantially increasing the complexity or size of the FM receiver.

Another object is to provide an FM receiver, as aforesaid, in which the existence of multi-path reception is indicated by the emitting of a characteristic sound from the existing loudspeaker of the FM receiver.

A further object is to provide an FM receiver, as aforesaid, and in which, during detection of multi-path reception, the gain of at least its IF amplifier is automatically controlled so as to ensure that multi-path reception will be effectively detected without regard to the level of the received FM broadcast signal.

In accordance with an aspect of this invention, an FM receiver having a circuit for receiving a selected FM broadcast signal, an FM detector for converting the selected FM broadcast signal to a corresponding audio signal, an audio amplifier for amplifying the audio signal and a loudspeaker operable by the amplified audio signal for producing corresponding audible sounds, is further provided with means for producing low frequency signals in response to the presence of amplitude-modulated components in the selected FM broadcast signal due to the multi-path reception thereof, and means for selectively applying the low frequency signals to the loudspeaker so that the latter provides an audible indication of the existence of the multi-path reception of the selected FM broadcast signal.

Further, it is a feature of this invention to decrease the gain of at least the IF amplifier of the circuit for receiving a selected FM broadcast signal when detecting the existence of multi-path reception by selectively applying the above mentioned low frequency signals through a smoothing circuit to the IF amplifier as an automatic gain control signal for the latter, so that the limiter effect of the circuit for receiving a selected FM broadcast signal will not preclude the amplitude-detection of the IF amplifier output when the selected FM broadcast signal is at a high level.

The above, and other objects, features and advantages of the invention, will be apparent in the following detailed description of an illustrative embodiment thereof which is to be read in connection with the accompanying drawing.

BRIEF DESCRIPTION OF THE DRAWING

The single FIGURE of the drawing is a block diagram of the essential components of an FM receiver provided with a detector for multi-path reception in accordance with an embodiment of this invention.

DESCRIPTION OF THE PREFERRED EMBODIMENT

Referring to the drawing in detail, it will be seen that the illustrated FM receiver is shown to comprise an antenna 1 and a circuit 2 for receiving a selected FM broadcast signal. The circuit 2 is shown to include an RF amplifier 3 for amplifying the FM broadcast signals received by the antenna 1, a mixer 4 for mixing the output of RF amplifier 3 with the output of a local oscillator 5 which is suitably tuned, and IF amplifier means shown to be comprised of a series of IF amplifiers 6, 7 and 8. The illustrated FM receiver is further shown to include an FM detector 9 receiving the output of IF amplifier 8 for converting the selected FM broadcast signal to an audio signal which is normally applied through an audio amplifier 10 to a loudspeaker 11 for operating the latter and thereby producing a corresponding audible sound.

In accordance with the present invention, the above described FM receiver is provided with an amplitude-detecting circuit 12 which detects the presence of amplitude-modulated components in the received FM broadcast signal, for example, in the output from IF amplifier 7, and which produces a corresponding low frequency output signal selectively applied to audio amplifier 10 in place of the audio signal from FM detector 9, for example, by means of a change-over switch 13. The amplitude-detecting circuit 12 is shown to include diodes $D_1$ and $D_2$ which detect the amplitude-modulated components in the output from IF amplifier 7, and a capacitor $C_1$ which eliminates the intermediate frequency components from such output. The change-over switch 13 is shown to include input contacts 13a and 13b respectively connected to the outputs of FM detector 9 and amplitude-detecting circuit 12, and a movable contact or slide 13c by which the input contacts 13a and 13b are alternately connected with an output contact 13d connected to audio amplifier 10.

During normal operation of the FM receiver shown in the drawing, that is, when it is desired that loudspeaker 11 should emit sounds corresponding to the selected FM broadcast signal being received by circuit 2, the movable contact or slide 13c of switch 13 is displaced upwardly from the position shown for connecting input contact 13a with output contact 13d and thereby applying the audio signal from FM detector 9 to audio amplifier 10 and interrupting or opening the circuit between the output of amplitude-detecting circuit 12 and the audio amplifier. However, when it is desired to determine whether multi-path reception exists in respect to the selected FM broadcast being received, changeover switch 13 is disposed in the position shown on the drawing for opening the circuit between FM detector 9 and audio amplifier 10 and for supplying the output from amplitude-detecting circuit 12 to the audio amplifier. With switch 13 in the illustrated position, if multi-path reception exists in respect to the selected FM broadcast signal, circuit 12 detects the resulting amplitude-modulated components in the output from IF amplifier 7 and produces corresponding relatively low frequency output signals which are applied to audio amplifier 10 so as to cause loudspeaker 11 to emit a characteristic sound. On the other hand, if the selected FM broadcast signal is being received only along a direct path from the transmitting antenna, that is, if multi-path reception does not occur, the output of IF amplifier 7 is not subjected to amplitude-modulation and, accordingly, low frequency signals do not appear at the output of circuit 12 and no sound originates from loudspeaker 11 with switch 13 in the illustrated position. Thus, in using the FM receiver according to this invention, switch 13 is initially disposed in the illustrated position and, if loudspeaker 11 then emits sound characteristic of multi-path reception, the antenna 1 is turned or adjusted until such sound no longer issues from the loudspeaker, whereupon, switch 13 is returned to its position for normal operation of the FM receiver, that is, to the position in which the output from FM detector 9 is applied to audio amplifier 10, with such normal operation of the FM receiver then occurring under conditions that are most desirable for receiving the selected FM broadcast signal.

If the circuit 2 for receiving a selected FM broadcast signal has a relatively high gain between its input and the output of IF amplifier 7, that is, the point at which the signal is supplied from circuit 2 to amplitude-detecting circuit 12, the limiting effect of the circuit 2 may prevent circuit 12 from producing the low frequency signals at its output in response to the presence of multi-path reception when the received FM broadcast signal has a high level. In order to avoid the foregoing problem, the arrangement according to this invention further includes means for reducing the gain of at least one of the RF and IF amplifiers during the detection of the multi-path reception.

More specifically, as shown in the drawing, a smoothing circuit 14 which includes a resistor R and a capacitor $C_2$ is connected to the output of amplitude-detecting circuit 12, and a second change-over switch 15 is connected between smoothing circuit 14 and the IF amplifiers 6 and 7 of circuit 2. As represented schematically by the broken line 17, switch 15 is ganged with switch 13 so that, when switch 13 is in its illustrated position for applying the low frequency output of amplitude-detecting circuit 12 to audio amplifier 10, switch 15 is in its closed position, as shown, and the low frequency signal at the output of circuit 12 causes smoothing circuit 14 to apply an automatic gain control signal through switch 15 to IF amplifiers 6 and 7 for reducing the gain of the latter. By reason of the reduction in gain of IF amplifiers 6 and 7, amplitude-detecting circuit 12 is effective to detect amplitude-modulated components of the selected FM broadcast signal over a wide range of levels of the latter so as to ensure that the existence of multi-path reception of such selected FM broadcast signal will be accurately indicated. Of course, when changeover switch 13 is displaced upwardly from its illustrated position for normal operation of the FM receiver, as previously described, the ganged switch 15 is similarly displaced for interrupting or opening the connection between smoothing circuit 14 and IF amplifiers 6 and 7, with the result that the described automatic gain control of IF amplifiers 6 and 7 will not be experienced during such normal operation of the FM receiver.

If desired, and as shown on the drawing, the front end of circuit 2, for example, the RF amplifier 3, may also be provided with means for reducing the gain thereof during the detection of multi-path reception. More specifically, as shown, a switch 16 which is in ganged relation to the switches 13 and 15, as indicated schematically by the broken line 18, may be interposed in a circuit for controlling the gain of RF amplifier 3. When switch 16 is in its illustrated closed position, which corresponds to the positioning of switches 13 and 15 for the detection of multi-path reception, the gain of RF amplifier 3 is suitably reduced to further ensure that the existence of multi-path reception will be accurately indicated by loudspeaker 11 even if the received FM broadcast signal has a very high level. Of course, when switches 13 and 15 are displaced upwardly from their illustrated position to permit normal operation of the FM receiver, as described above, switch 16 is similarly displaced to its open condition so as to restore RF amplifier 3 to its normal gain condition.

Although amplitude-detecting circuit 12 has been shown and described as being connected to the output of IF amplifier 7, it is to be noted that circuit 12 may be alternatively connected to the output of IF amplifier 6 or 8, or to the output of RF amplifier 3 so as to produce the low frequency signal for operating loudspeaker 11 in response to the presence of amplitude-modulated components in the output of the respective amplifier.

It will be seen that, with the FM receiver embodying this invention, as described above, the presence of multi-path reception is positively indicated by the emitting of a characteristic sound from the existing loudspeaker 11 merely by the addition to the existing or conventional FM receiver of relatively simple and inexpensive components, namely, the amplitude-detecting circuit 12 and the change-over switches.

Although a preferred embodiment of the invention has been described in detail herein with reference to the accompanying drawing, it is to be understood that the invention is not limited to that precise embodiment, and that various changes and modifications may be effected therein by one skilled in the art without departing from the scope or spirit of the invention as defined in the appended claims.

What is claimed is:

1. In an FM receiver having a circuit for receiving a selected FM broadcast signal including RF amplifier means and IF amplifier means, an FM detector for converting the selected FM broadcast signal to a corresponding audio signal, an audio amplifier for amplifying said audio signal, and a loudspeaker operable by the amplified audio signal for producing corresponding audible sounds; the combination of means for producing low frequency signals in response to the presence of amplitude-modulated components in the received FM broadcast signal due to the multi-path reception thereof, means for selectively applying the low frequency signals to said loudspeaker including a first switch having first and second positions in which said audio signal from said FM detector and said low frequency signals are respectively applied through said first switch to said audio amplifier, so that the loudspeaker provides an audible indication of the existence of said multi-path reception of the selected FM broadcast signal; and means for producing an automatic gain control signal for said IF amplifier means in response to said low frequency signals, and a second switch ganged with said first switch for applying said automatic gain control signal to said IF amplifier means only when said first switch is in said second position of the latter.

2. An FM receiver according to claim 1; further comprising means for controlling the gain of said RF amplifier means including a third switch ganged with said first and second switches for lowering the gain of said RF amplifier means when said first switch is disposed in said second position of the latter.

3. In an FM receiver having a receiving circuit comprised of an RF amplifier and an IF amplifier for receiving an FM broadcast signal to which said receiver is selectively tuned, an FM detector coupled to said IF amplifier for converting the received FM signal to a corresponding audio signal, an audio amplifier for amplifying said audio signal, and a loudspeaker coupled to said audio amplifier for producing audible sounds corresponding to the signal amplified by said audio amplifier, the improvement comprising: amplitude detecting means coupled to said receiving circuit for detecting amplitude modulation components in said received FM broadcast signal caused by multi-path reception of said FM broadcast signal, said amplitude detecting means producing relatively low frequency output signals in response to detected amplitude modulation components; and means for selectively applying said corresponding audio signal produced by said FM detector and said low frequency output signals produced by said amplitude detecting means to said audio amplifier, whereby said loudspeaker produces audible sounds corresponding to said audio signal, or a characteristic audible sound corresponding to said output signals and indicative of said multi-path reception.

4. An FM receiver according to claim 3; in which said means for selectively applying said corresponding audio signal produced by said FM detector and said low frequency output signals to said audio amplifier includes a switch having a first position in which said FM detector is coupled to said audio amplifier and a second position in which said amplitude detecting means is coupled to said audio amplifier.

5. An FM receiver according to claim 3; in which said amplitude-detecting means is coupled to the output of said IF amplifier.

6. An FM receiver according to claim 3 further comprising means responsive to said low frequency output signals for reducing the gain of at least one of said RF and IF amplifiers.

7. An FM receiver according to claim 6; in which said means for reducing the gain includes a smoothing circuit receiving said low frequency output signals, and a switch through which the output of the smoothing circuit is applied to said IF amplifier as an automatic gain control for the latter.

* * * * *